US008121312B2

(12) United States Patent
Horbach et al.

(10) Patent No.: US 8,121,312 B2
(45) Date of Patent: Feb. 21, 2012

(54) WIDE-BAND EQUALIZATION SYSTEM

(75) Inventors: Ulrich Horbach, Canyon Country, CA (US); Ashish Aggarwal, Santa Clarita, CA (US); Pedro Manrique, Pasadena, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 657 days.

(21) Appl. No.: 12/293,062

(22) PCT Filed: Mar. 14, 2007

(86) PCT No.: PCT/US2007/064006
§ 371 (c)(1),
(2), (4) Date: Mar. 5, 2009

(87) PCT Pub. No.: WO2007/106872
PCT Pub. Date: Sep. 20, 2007

(65) Prior Publication Data

US 2009/0316930 A1 Dec. 24, 2009

Related U.S. Application Data

(60) Provisional application No. 60/782,369, filed on Mar. 14, 2006.

(51) Int. Cl.
*H03G 5/00* (2006.01)

(52) U.S. Cl. .......................... 381/99; 381/103; 330/157

(58) Field of Classification Search .................... 381/99, 381/103, 349
See application file for complete search history.

(56) References Cited

U.S. PATENT DOCUMENTS

2006/0142999 A1* 6/2006 Takada et al. ................ 704/205
2006/0241797 A1* 10/2006 Craig et al. ..................... 700/94
2008/0118078 A1* 5/2008 Asada et al. ................... 381/74

FOREIGN PATENT DOCUMENTS

EP 0 898 364 A2 * 2/1999
WO WO 2007/016527 A1 * 8/2007

* cited by examiner

*Primary Examiner* — Thanh V Pham
(74) *Attorney, Agent, or Firm* — The Eclipse Group LLP

(57) ABSTRACT

A Wide-band Equalization System ("WBES") based on near- and far-field measurement data. The WBES includes a sub-woofer equalizer having an FIR filter together with decimator and interpolator filters for processing low frequency signals. The WBES may also include satellite channels for processing mid- and high-frequency signals, where each satellite channel includes cascaded IIR filters that process mid-frequency and high-frequency signals, respectively. The WBES may also include a DSP that performs the functions required by the IIR and FIR filters.

23 Claims, 14 Drawing Sheets

WIDE-BAND EQUALIZATION SYSTEM

CROSS-REFERENCE TO RELATED APPLICATIONS

This application claims the benefit of U.S. Provisional Application Ser. No. 60/782,369 entitled "Wide Band Equalization in Small Spaces," filed Mar. 14, 2006, which application is incorporated herein, in its entirety, by this reference.

BACKGROUND OF THE INVENTION

1. Field of the Invention

The invention is generally related to an equalization system that improves the sound quality of an audio system in a listening room. In particular, the invention relates to an equalization system that improves the sound quality of an audio system based upon near- and far-field measurement data.

2. Related Art

The aim of a high-quality audio system is to faithfully reproduce a recorded acoustic event, such as a concert hall experience, in smaller enclosed spaces, such as a listening room, a home theater or entertainment center, a PC environment, or an automobile.

The perceived sound quality of an audio system in smaller enclosed spaces depends on several factors: quality and radiation characteristics of the loudspeakers (e.g., on- and off-axis frequency responses); placement of the loudspeakers at their connect positions according to the standard (for example, ITU 5.1/7.1); acoustics of the room in general (low frequency modes, reverb time, frequency-dependent absorption, effects of room geometry and dimensions, location of furniture, etc.); and nearby reflective surfaces and obstacles (e.g., on-wall mounting, bookshelves, TV sets, etc.).

In order to provide an optimum listening experience in such enclosed spaces, a digital "room equalization" system may be used. In general, equalization is the process of either boosting or attenuating certain frequency components in a signal. There are several types of equalization, each with a different pattern of attenuation or boost. Examples are a high-pass filter, bandpass filter, graphic equalizer, and parametric equalizer.

In a multiband parametric equalizer ("EQ"), center frequency, bandwidth (Q-factor) or peak shape, and gain (peak amplitude above a given reference) in each of the bands may be adjusted to flatten a measured frequency response at a listening location (e.g., a seat in a listening room), Typically, a cascade of second-order IIR ("infinite impulse response") filter sections ("biquads") is used to control frequency response. A digital signal processor ("DSP") may generate test signals for each loudspeaker (e.g., either white or pink noise or logarithmic sweeps), in order to capture room responses at a desired listening location. For that purpose, an omni-directional microphone may be positioned at the listening location and connected to a signal analyzer or back to the DSP.

In FIG. 1, a test system 100 that uses an equalizer to produce a signal at the listening location that resembles the input signal is shown. In an example of operation, signal source 104 produces a test signal, which is amplified by the preamplifier 106 and processed by the equalizer 108. The test signal is then amplified by the power amplifier 110 and transmitted to a loudspeaker 112. The loudspeaker 112 reproduces the test signal as an acoustic pressure wave that is emitted from the loudspeaker 112, which is then picked up by the test microphone 116 and passed to a signal analyzer 120.

In this example of operation, the received test signal is observed at the signal analyzer 120 and, in response, the test signal may be adjusted accordingly through the equalizer 108. In other implementations, the test microphone 116 may be directly in signal communication with the equalizer 108, where the received test signal may be automatically processed by the equalizer 108, which may include digital signal processors ("DSPs"). Additionally, the test microphone 116 may be positioned at a listening location in a room or hall, where it can then capture the impulse responses at that particular listening location.

In this example, if the equalizer 108 is a parametric EQ with multiple filters, the multiple filters may be set manually, so that, for example, a displayed response curve, on an output device (not shown) in signal communication with the equalizer 108, becomes smoother, or automatically, with the aid of an external processor such as, for example a personal computer ("PC") or design logic built into the DSP itself. In general, it is difficult and suboptimal to adjust a set of cascaded parametric filter sections because of overlap. Two or more of the parametric filter sections may affect the same frequency band of interest, which leads to the difficulty that a large number of parameters need to be adjusted simultaneously. At low frequencies, it is important to accurately suppress individual room modes. In order to avoid approximation errors and quantization noise, a FIR ("finite impulse response") filter may be directly used and operated at a low sample rate (for example, utilizing decimation) to minimize processing cost.

In adjusting a frequency response, it is important to distinguish between resonances (e.g., loudspeaker cabinet material resonances, or standing waves at low frequencies in rooms) and interferences due to multiple reflections that lead to nulls (dips) in the frequency response. Resonances and room modes need to be suppressed, e.g., with a notch filter, while narrow-band interference dips strongly depend on the measurement position and generally should be left unaltered. An attempt to correct narrow-band interference dips may introduce high-gain peak filters that are perceived as resonances.

In an intermediate frequency band (between approximately 100 Hz to 1000 Hz), it is desirable to correct errors related to the source only, not the whole listening room. For example, eliminating sonic differences between the main stereo speakers and the center speaker, which may be close to a reflective surface such as a TV set, leads to an improved stereo image. This so-called "source-related" correction is independent of a particular listening location, whereas a complete room correction would be valid at a single point only.

At high frequencies (i.e., greater than 1000 Hz), the in-room response is normally not flat, but decreases with frequency. This may be addressed by a so-called "target function." Equalization is performed such that the final response approximates the target function. However, the correct target function choice depends on the absorption properties of the particular room and the radiation characteristics of the loudspeakers, and is thus a priori unknown. In a (domestic) listening room solution, a set of near-field measurements close to the loudspeakers provides frequency response data above typically 1000 Hz, thus eliminating the need for a target function. In all automobile, an adjustable target function may be provided with the EQ algorithm.

Along with the foregoing considerations, there are many other factors to be considered when trying to optimize the sound quality audio systems utilized in small spaces such as listening rooms or cars. Therefore, there is always a continuing need to improve the sound quality of these audio systems, in particular, by improving the fully-automated equalization of the responses of loudspeakers located in these small spaces.

SUMMARY

A Wide-band Equalization System ("WBES") for equalizing an audio system based on near- and far-field measurement data is disclosed. The WBES may include a subwoofer EQ having an FIR filter together with decimator and interpolator filters for processing low frequency signals. The WBES may also include satellite channels for processing mid- and high-frequency signals, where each satellite channel includes cascaded IIR filters that process mid-frequency and high-frequency signals. The WBES may also include one or more DSPs that perform the functions required by the IIR and FIR filters and may also generate test signals for a device under test.

In an example operation, the WBES may perform a method whereby low-frequency, mid-frequency, and high-frequency FIRs are generated from a captured set of room impulse responses ("RIRs"), with a low-frequency filter of the audio system then implemented using the low-frequency FIR, a decimator filter, and an interpolator filter. Mid- and high-frequency filters of the audio system may be implemented utilizing cascaded infinite impulse response ("IIR") filters derived from the mid- and high-frequency FIRs.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

In the following description of examples of implementations of the present invention, reference is made to the accompanying drawings that form a part hereof, and which show, by way of illustration, specific implementations of the invention that may be utilized. Other implementations may be utilized and structural changes may be made without departing from the scope of the present invention.

Figure 2:
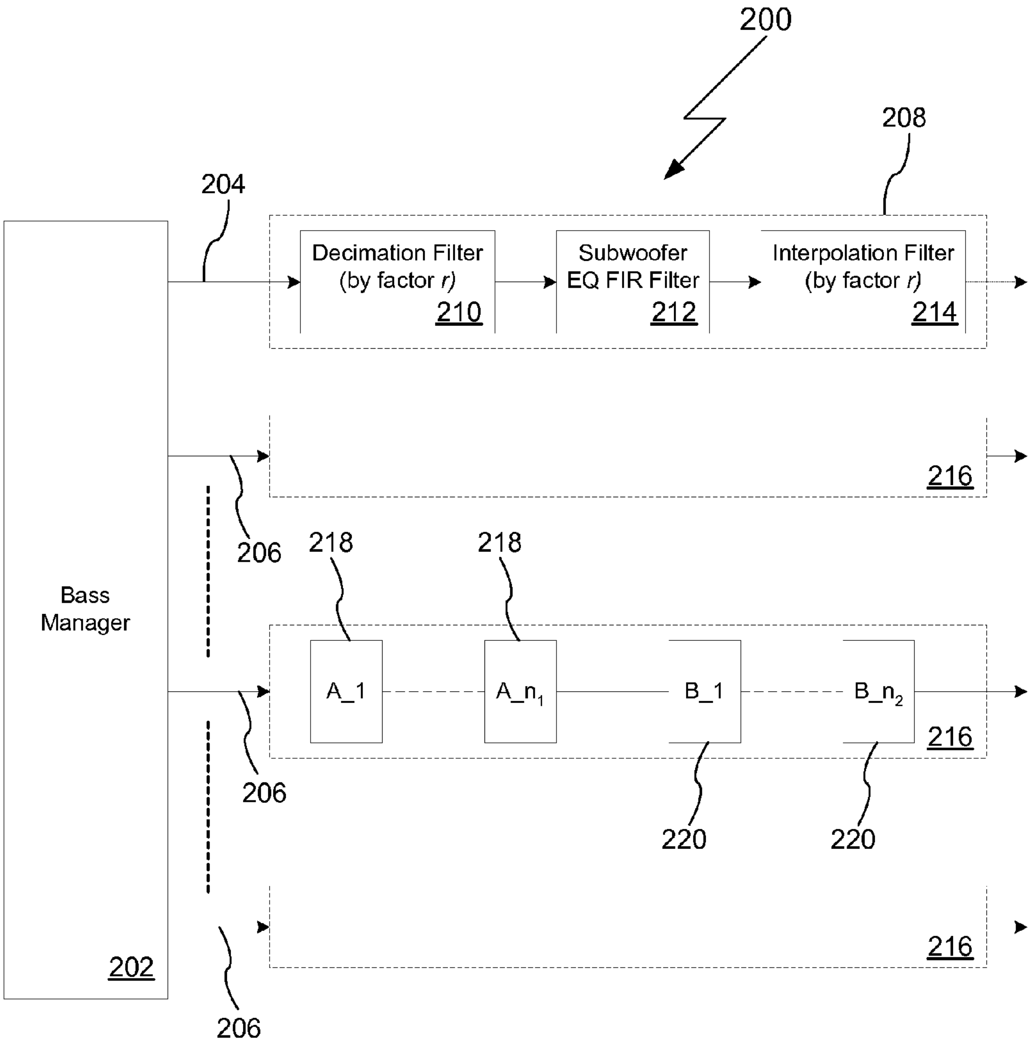
FIG. 2 shows a block diagram illustrating an example of an implementation of a Wide-band Equalization System ("WBES") in accordance with the invention.

In FIG. 2, a block diagram illustrating an example of an implementation of a wide band equalization system ("WBES") 200 in accordance with the invention is shown. WBES 200 may include several signal processing modules that process low-, mid-, and high-frequency signals. As an example of operation, a low frequency signal 204 is generated by the bass manager 202, which may also generate m mid- and high-frequency signals 206, where m typically may be 5-7. The low-frequency signal 204 may be processed by a subwoofer EQ 208 utilizing a room equalization algorithm. The subwoofer EQ 208 includes a decimation filter 210, a subwoofer equalizer FIR filter 212 of order $n_{fir}$ (typically $n_{fir}$=256 . . . 512), and an interpolation filter 214 to resample the signal to the original sample rate (typically, the decimation/interpolation ratio r=32 . . . 64).

Mid- and high-frequency signals 206 generated by the bass manager 202 may be processed by "satellite" channels 216 1, 2, . . . , and m (typically, m=5 or 7). Each satellite channel 216 may include a cascade of mid-frequency-EQ second-order IIR biquad sections 218 A_1, . . . , A_$n_1$, and high-frequency-EQ biquads 220 sections B_1, . . . , B_$n_2$, where, as an example, $n_1=n_2=3$.

Figure 1:
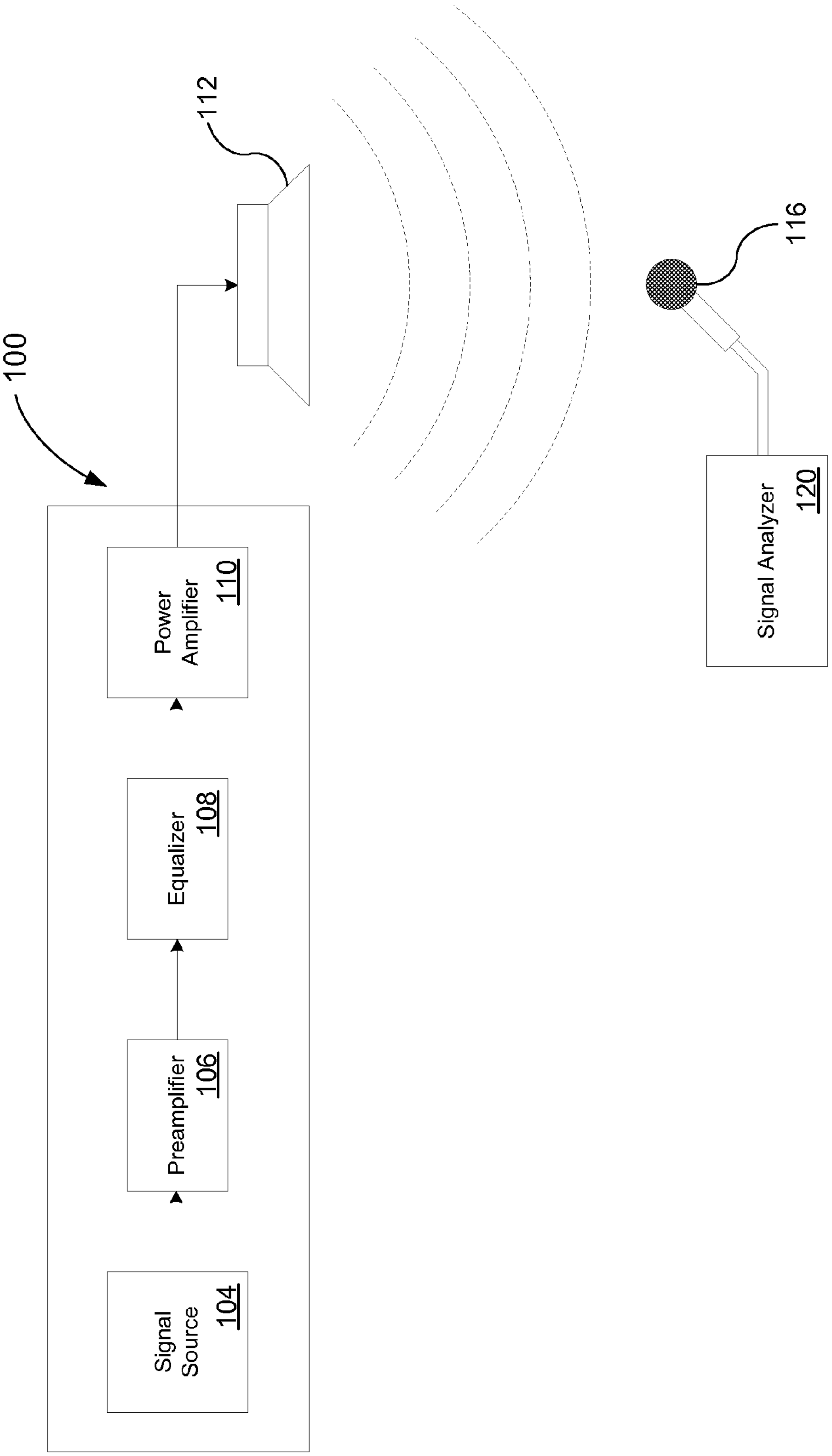
FIG. 1 (Prior Art)
FIG. 1 shows a block diagram illustrating all example of a known room equalization system.
Figure 3:
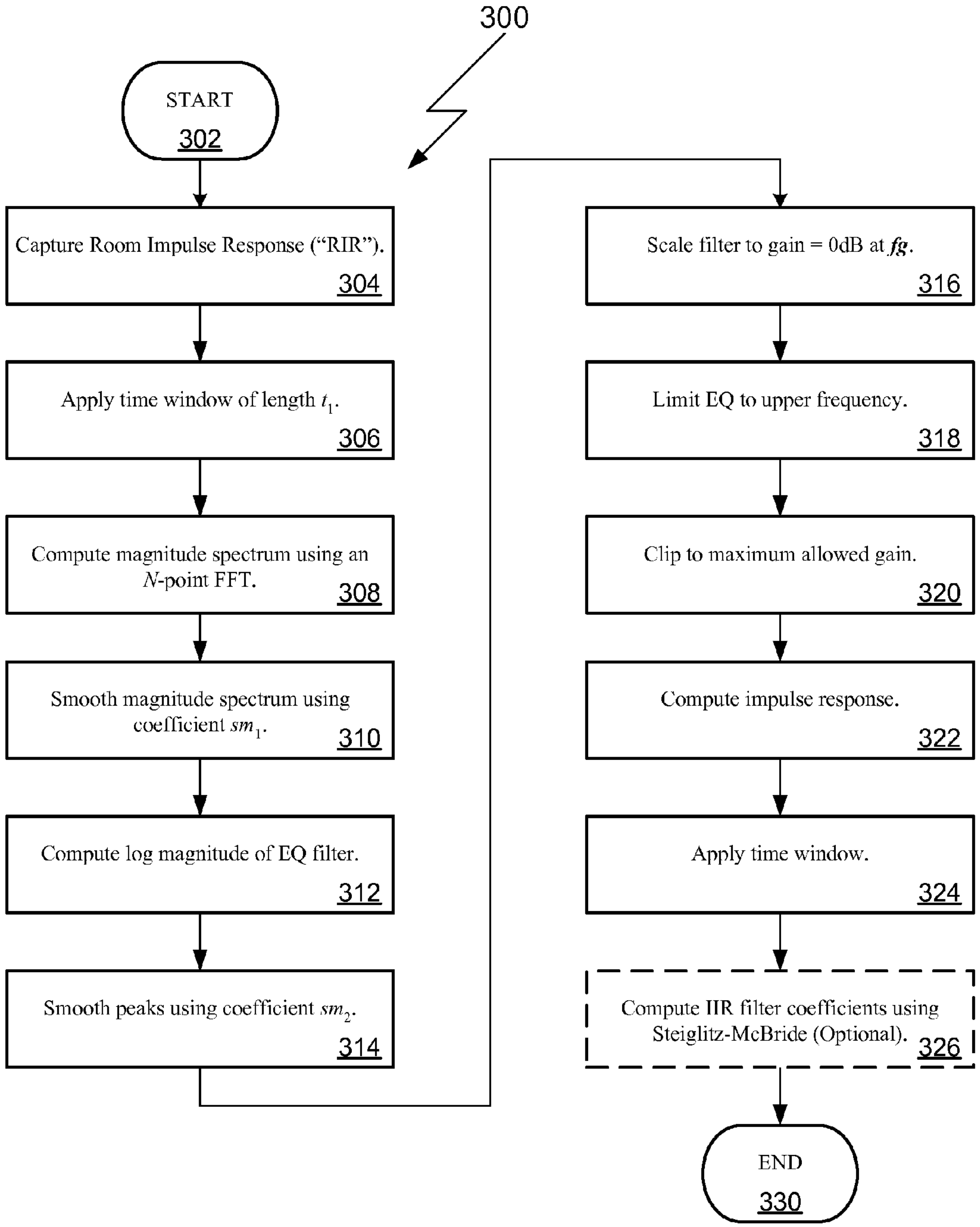
FIG. 3 shows a flow diagram illustrating an example of a method performed by the WBES of FIG. 2 for correcting the response of an individual loudspeaker based upon near-field, high-frequency measurements.
Figure 11:
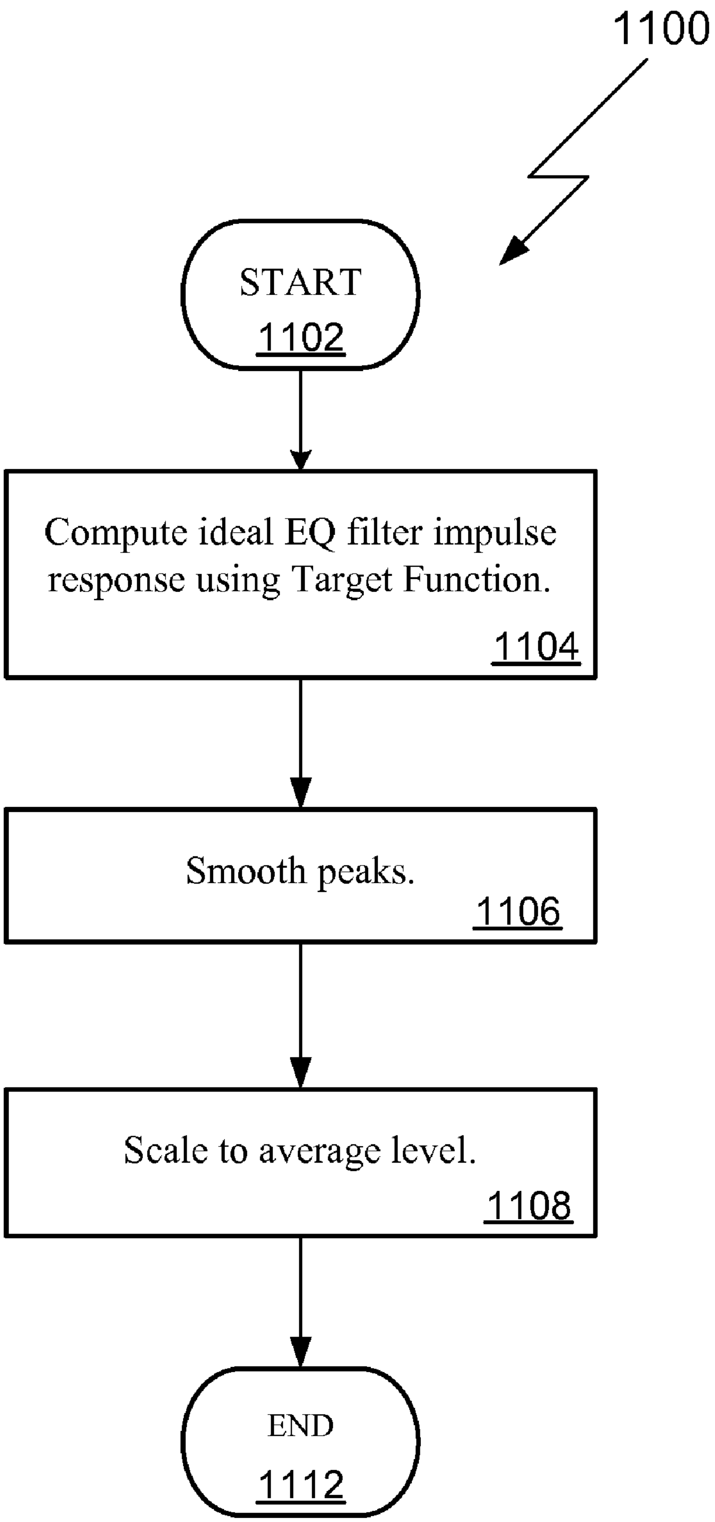
FIG. 11 shows a flow diagram illustrating an example of a method performed by the WBES of FIG. 2 for correcting the response of an individual loudspeaker based upon far-field, low-frequency measurements.
Figure 13:
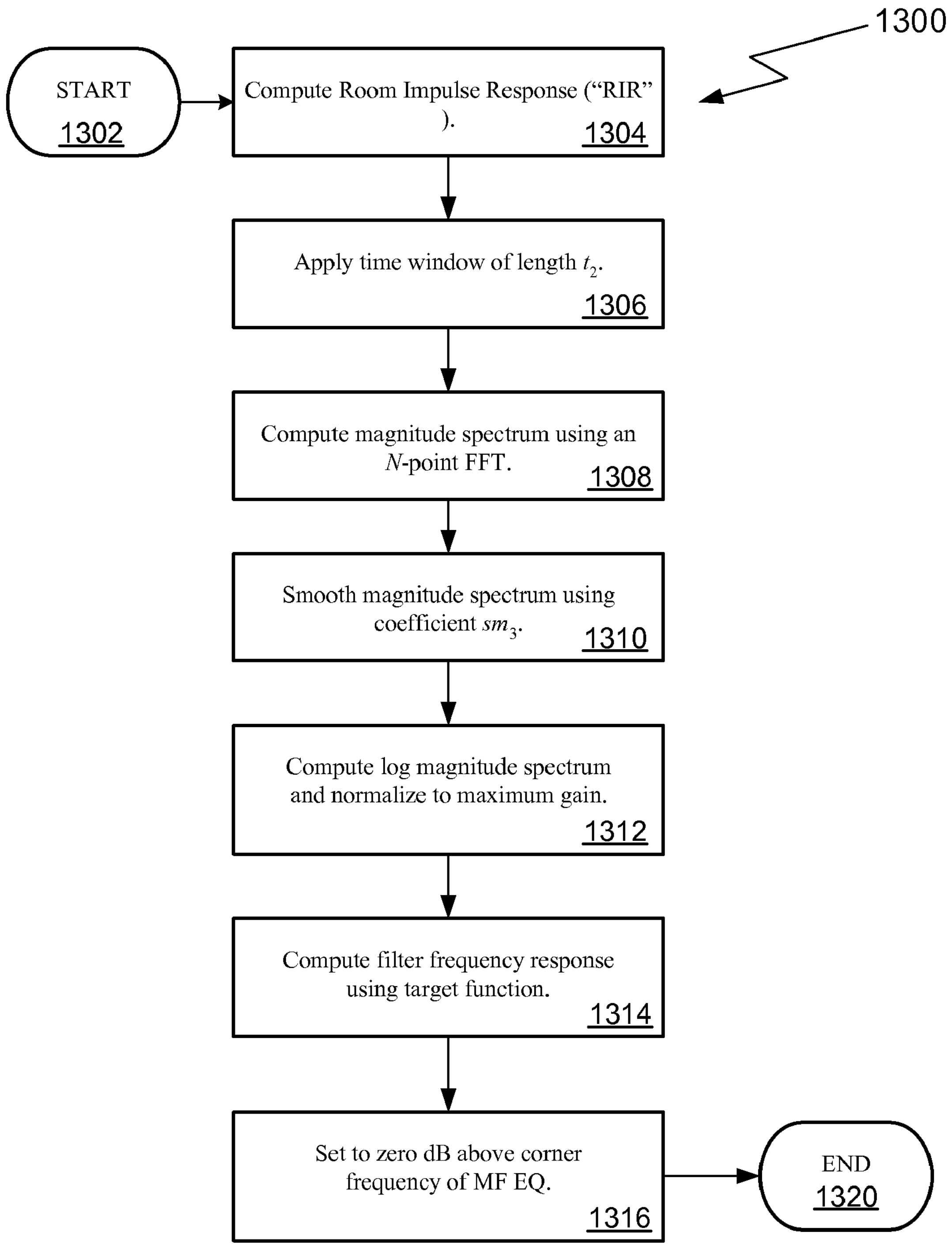
FIG. 13 shows a flow diagram illustrating an example of a method performed by the WBES of FIG. 2 for correcting the response of an individual loudspeaker based upon far-field, mid-frequency measurements.

The filter coefficients for the mid-frequency-EQ IIR filters 218 and the high-frequency-EQ IIR filters 220 are based on measured room responses and may be obtained by utilizing a room equalization method. These IIR filters are higher order filters approximated from mid- and high-frequency FIRs designed from far-field and near-field measurement data. FIGS. 3, 11, and 13 illustrate examples of room equalization methods used to obtain the filter coefficients for the IIR and FIR filters shown in FIG. 2. These room equalization methods may be implemented in a common DSP that also performs real-time signal processing (i.e., the actual filtering). Turning to FIG. 3, a flow chart illustrating an example of a room equalization method is shown, where the room equalization method is designed for a near-field, high-frequency EQ configured to correct the impulse response of an individual loudspeaker and its immediate surroundings in a room above approximately 1 kHz. The process 300 starts in step 302 and in step 304, a room impulse response ("RIR") may be captured at a defined location in a listening room. As an example, an omni-directional test microphone may be positioned near a loudspeaker, e.g., at a distance of approximately 0.5-1.5 meters. In general, an excitation signal, which may be a signal produced by a logarithmic sine sweep, is fed to the device under test ("DUT"), in this case, the loudspeaker, and the response of the DUT is captured and compared with the original signal, as shown in FIG. 1.

In step 306, the sequence (i.e., the impulse response) is multiplied by a rectangular or other time window, thus setting samples above a defined value to $t_1$ zero (where $t_1$ is typically 2-4 milliseconds ("ms") or 100-200 samples at a sample rate of 48 kHz). This "windowing" suppresses unwanted reflections from boundaries that are not considered near-field. Next, in step 308, the magnitude spectrum F(i), with i=1, . . . , N/2, is generated using an N-point FFT, where, for example, N=8192. In step 310, the magnitude spectrum generated in step 308 is smoothed with a smoothing factor $sm_1$, resulting in Fs(i)=mean {F(i/$sm_1$) . . . F(i*$sm_1$)}. Typically, the smoothing factor $sm_1$ may be equal to approximately 1.05-1.2.

Figure 6:
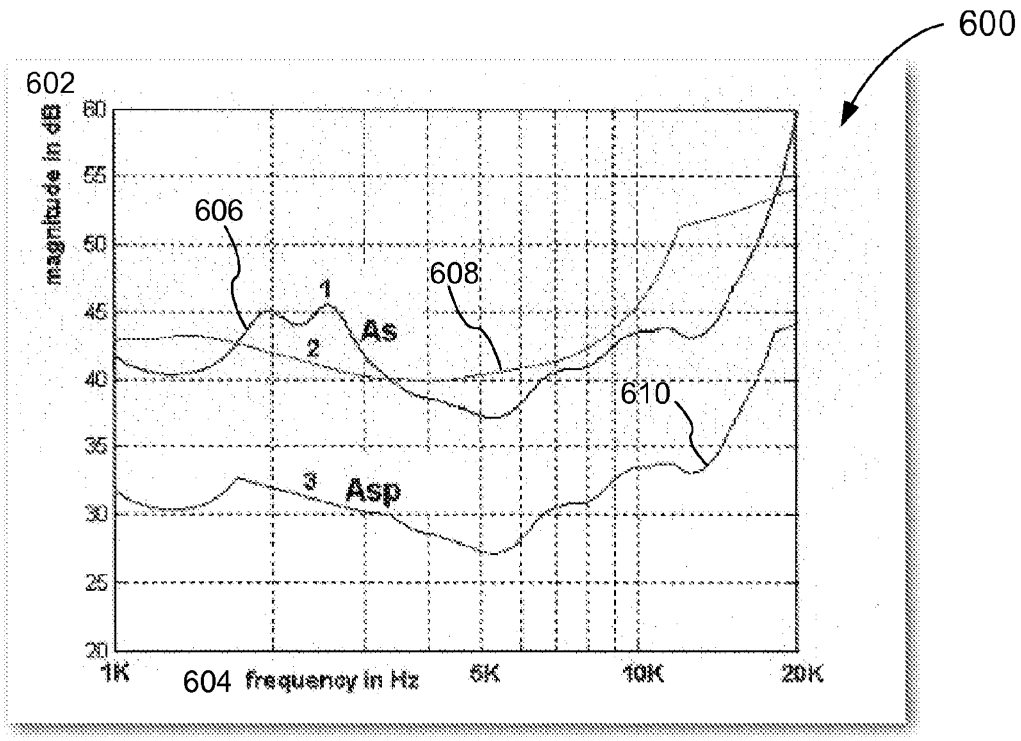
FIG. 6 shows a graphical representation of an example of plots of the frequency responses of an ideal EQ filter, a smoothed version of that frequency response, and the smoothed version with those parts of the frequency response of an ideal EQ filter that lie above the smoothed version of the frequency response cut from the plot produced by the method described in FIG. 3.

Proceeding to step 312, the log-magnitude spectrum As of the inverse system (which is the EQ-filter) is determined by As=−20*log 10(Fs). Next, in step 314, the peaks of As are smoothed with smoothing factor $sm_2$, which generally is larger than $sm_1$ (e.g., $sm_2$ is typically equal to 1.2-1.6), resulting in Asp (see plot 610, FIG. 6). This "smoothing of peaks" is illustrated in FIG. 6. It ensures that the frequency-dependent filter gain does not exceed values of the average response, while fine details are preserved below that average response.

Figure 7:
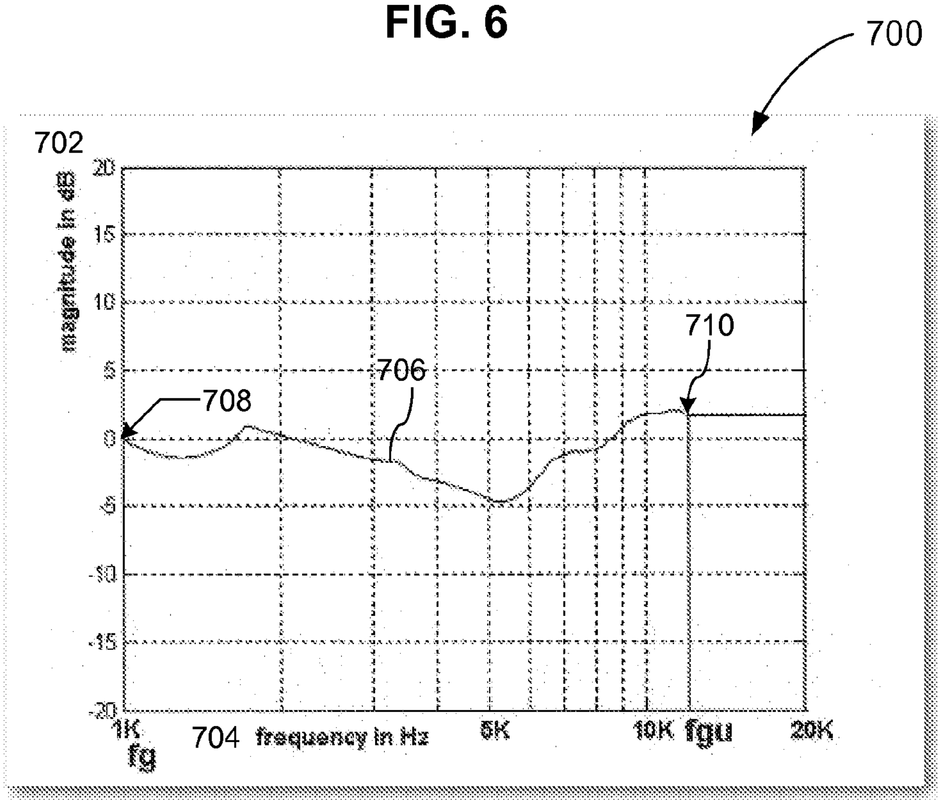
FIG. 7 shows a graphical representation of an example of a plot of a frequency response of an EQ filter impulse response that has been scaled, limited to an upper frequency, and clipped to a maximum gain by setting filter values above a defined gain value to that value produced by the method described in FIG. 3.

In step 316, the EQ filter is scaled such that its gain is 0 dB at its operating frequency fg (for example, fg=1 kHz; see point 708, FIG. 7). Below fg, the filter response is replaced by the constant 0 dB. Next, in step 318, the filter response is limited to its value at a frequency fgu (typically 10-15 kHz), ensuring that there is no excessive gain to, for example, equalize a tweeter with a natural roll-off in case the microphone is not positioned exactly at the main axis. In step 320, filter values above a defined gain value are set to that defined gain value, in effect, further limiting the maximum gain of the response and clipping the peaks of the response.

In step 322, an EQ filter impulse response is determined from the scaled, limited, and clipped EQ filter spectrum generated in steps 316, 318, and 320, assuming minimum-phase. It is appreciated by those skilled in the art that the EQ filter impulse response generated in step 322 may be generated using several techniques, including the Hilbert transform. In step 324, a rectangular time window is multiplied with the resulting impulse response according to the desired filter length of, e.g., 64 samples (see point 808, FIG. 8).

Figure 9:
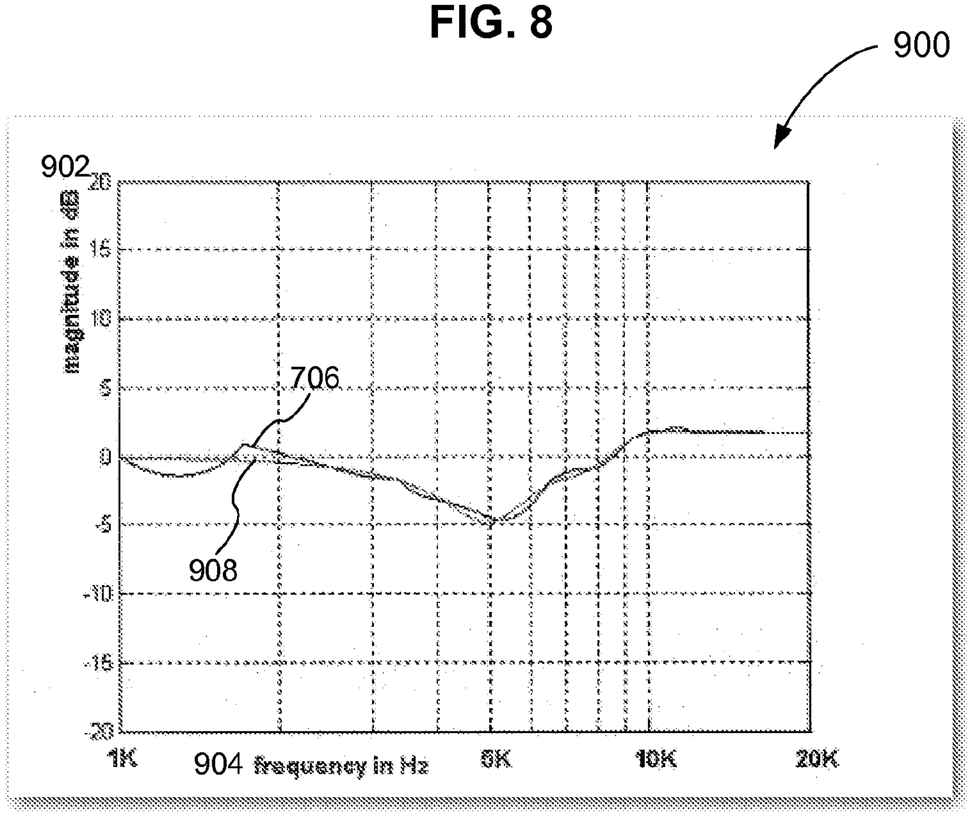
FIG. 9 shows a graphical representation of an example of a plot of frequency responses of an approximated IIR EQ filter impulse response produced by the method described in FIG. 3.

In optional step 326, an equivalent IIR filter impulse response of low order (typically 2-8) may be generated using a known method, such as the iterative Steiglitz-McBride method that approximates the original FIR impulse response in the time domain by the impulse response of an IIR system (see plot 908, FIG. 9). (For example, the macro "stmbc," which is part of the MATLAB package, may be used). The process 300 then ends in step 330.

Figure 4:
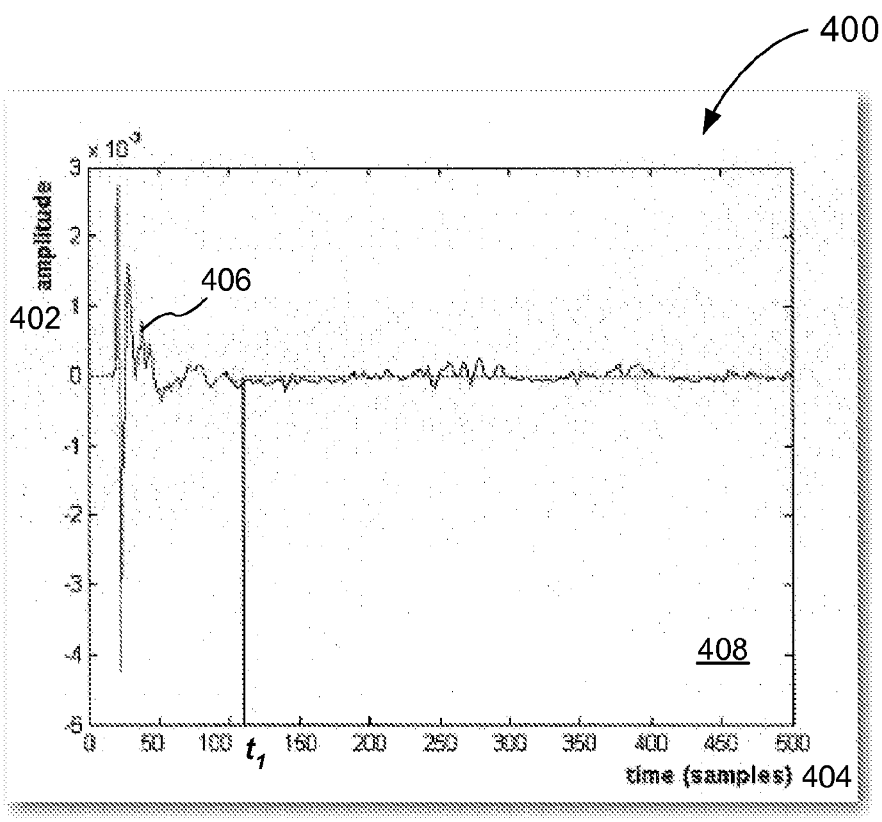
FIG. 4 shows a graphical representation of an example of a plot of amplitude versus time (in samples) of a raw (i.e., unwindowed) and a windowed impulse response produced by the method described in FIG. 3.

A graphical representation 400 of an example of a plot 406 of amplitude 402 (in dBs) versus time 404 (in samples) of a room impulse response ("RIR") is shown in FIG. 4. The RIR impulse response, which is captured in step 306, FIG. 3, is multiplied by a time window 408 for samples above a defined value $t_1$ such that these samples are set to zero (see step 308, FIG. 3). Typically, $t_1$ may be equal to 2-4 ms or 100-200 samples at a sample rate of 48 kHz (in FIG. 4, $t_1$ is equal to approximately 110 samples). This "windowing" suppresses unwanted reflections from boundaries that are not considered near-field.

Figure 5:
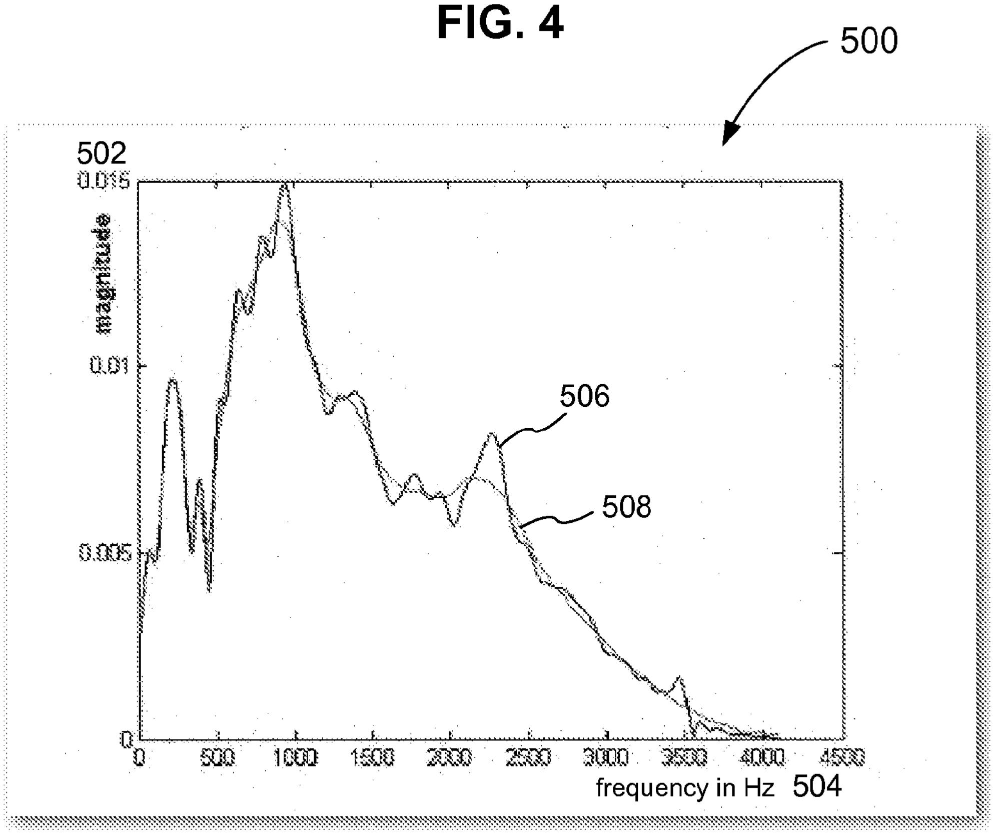
FIG. 5 shows a graphical representation of an example of a plot of the frequency response obtained using an N-point FFT (N=8192), and the frequency response smoothed by a smoothing factor produced by the method described in FIG. 3.

Tuning to FIG. 5, a graphical representation 500 of an example of plots 506 and 508 of magnitude 502 (in dBs) versus frequency 504 (in Hz) for the spectrum of the RIR 406 in FIG. 4 is shown, Plot 506 is the magnitude spectrum F(i), with i=1, . . . , N/2, generated using an N-point FFT, where N=8192. Plot 508 is the magnitude spectrum of plot 506 smoothed with a smoothing factor $sm_1$, resulting in Fs(i) =mean {F(i/$sm_1$) . . . F(i*$sm_1$))}. Typically, the smoothing factor $sm_1$ may be equal to approximately 1.05-1.2.

FIG. 6 shows a graphical representation 600 of an example of plots 606, 608, and 610 of magnitude 602 (in dBs) versus frequency 604 (in Hz) of a frequency response of an ideal EQ filter, a smoothed version of that frequency response, and the smoothed version with those parts of the frequency response of an ideal EQ filter that lie above the smoothed version of the frequency spectrum cut from the plot, respectively. Plot 606 is a plot of the log-magnitude spectrum of the inverse system (which is the EQ-filter) As=−20*log 10(Fs), Plot 608 is a plot of the As of Plot 606 that has been smoothed with smoothing factor $sm_2$, which generally is larger than $sm_1$ (e.g., $sm_2$ is typically equal to 1.2-1.6). Cutting that portion of plot 606 that lies above plot 608 results in plot 610, denoted as Asp. This "smoothing of peaks" ensures that the frequency-dependent filter gain does not exceed values of the average response, while fine details are preserved below that average response.

In FIG. 7, a graphical representation 700 of an example of a plot 706 of magnitude 702 (in dBs) versus frequency 704 (in Hz) of an EQ filter frequency response is shown. The EQ filter generating the response illustrated by plot 706 has been scaled such that its gain is 0 dB at its operating frequency fg (at point 708, where fg is equal to 1 kHz). Below fg, the filter response is replaced by the constant 0 dB. Above a frequency fgu (at point 710, where fgu is typically equal to approximately 10-15 kHz), the filter response is limited to its value at fgu, ensuring that there is no excessive gain to, for example, equalize a tweeter with a natural roll-off in case the microphone is not positioned exactly at the main axis. The maximum gain may be further limited by setting filter values above a defined gain value to that value (i.e., clipping).

Figure 8:
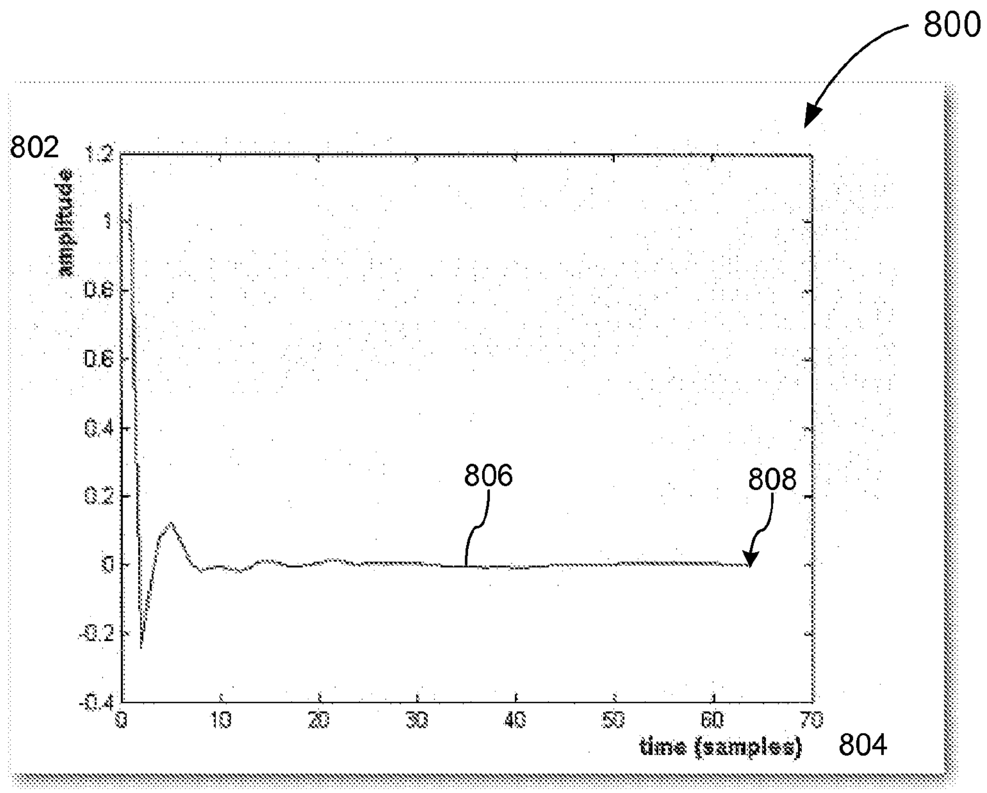
FIG. 8 shows a graphical representation of an example of a plot of amplitude versus time (in samples) of an EQ filter impulse response that is time-limited produced by the method described in FIG. 3.

FIG. 8 shows a graphical representation 800 of an example of a plot 806 of magnitude 802 (in dBs) versus time 804 (in samples) of an EQ filter impulse response that is generated from the scaled, limited, and clipped EQ filter frequency response shown by plot 706 of FIG. 7, assuming minimum-phase. It is appreciated by those skilled in the art that the EQ filter impulse response depicted by plot 806 may be generated using several techniques, including the Hilbert transform. The result of the transform may be time limited to the desired filter length by applying a rectangular window, which in FIG. 8 is the length of 64, denoted by point 808.

In FIG. 9, a graphical representation 900 of an example of plots 706, FIG. 7, and 908 of magnitude 902 (in dBs) versus frequency 904 (in Hz) is shown. Plot 706, FIG. 7, depicts the EQ filter frequency response that has been scaled to frequency fg, limited above a frequency fgu, and clipped at a maximum gain. Alternatively, an equivalent IIR filter impulse response of low order (typically 2-8) may be generated using a known method, such as the iterative Steiglitz-McBride method that approximates the original FIR impulse response in the time domain by the impulse response of an IIR system. (For example, the macro "stmbc," which is part of the MATLAB package, may be used). An example of an equivalent IIR filter frequency response is shown by plot 908.

Figure 10:
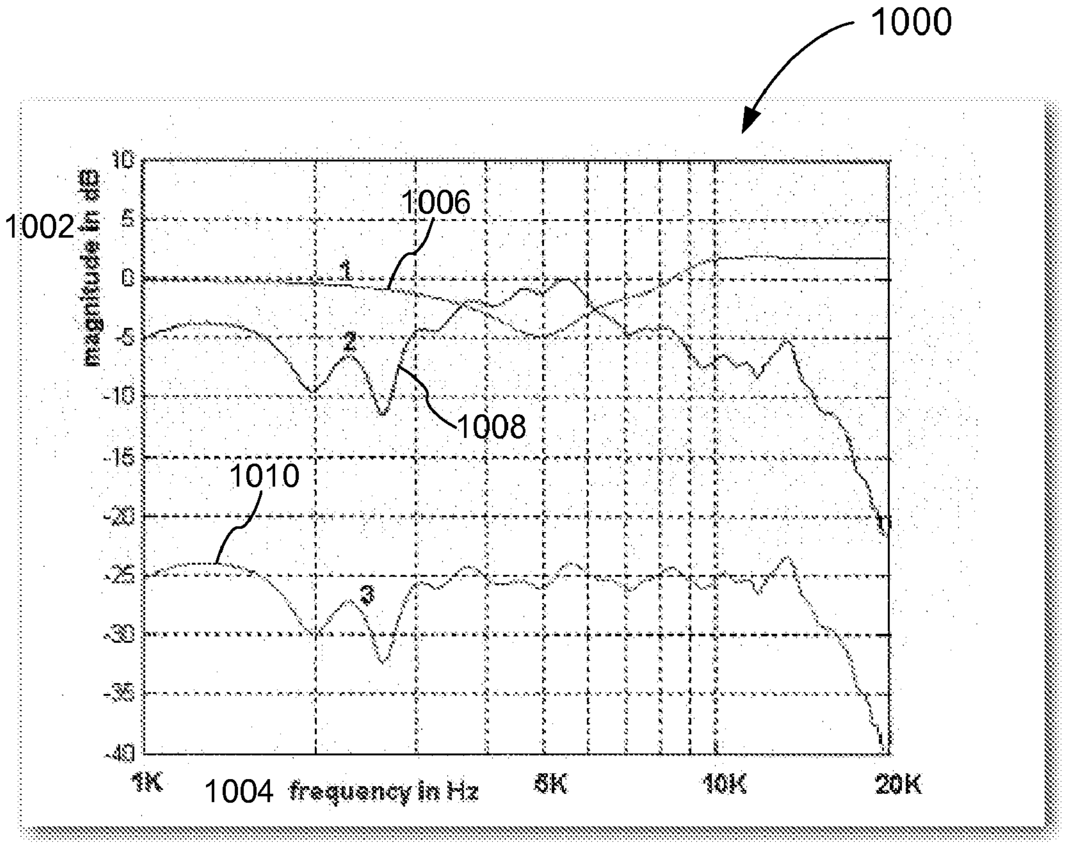
FIG. 10 shows a graphical representation of an example of a plot of frequency responses of a captured room impulse response, an EQ filter impulse response, and the result of applying the EQ filter impulse response to the captured room impulse response produced by the method described in FIG. 3.

FIG. 10 shows a graphical representation 1000 of all example of plots 1006, 1008, and 1010 of magnitude 602 (in dBs) versus frequency 604 (in Hz) that illustrate the effect of a near-field EQ on a loudspeaker in a small room. Plot 1008 is a plot of the log-magnitude frequency response of the loudspeaker obtained in the near field. Plot 1006 is a plot of the log-magnitude frequency response of the EQ filter frequency response generated as shown in FIG. 7 that is applied to the frequency response depicted by plot 1008, with the result being a frequency response depicted by plot 1010. From plot 1010, it is apparent that the measured frequency response is corrected within the band of interest, i.e., above 1 kHz, where the frequency response is flatter, while less audible, strongly position-dependent fine details or interference notches are left unaltered.

Turning to FIG. 11, a flow chart illustrating another example of a room equalization method is shown, where the method is designed for a far-field, low-frequency EQ. The process 1100 may be a subset of the process 300 shown in FIG. 3, with the following exceptions. The process starts in step 1102. Next, in step 1104, the captured frequency response may be multiplied by a "target function" in order to obtain the ideal EQ filter response. Typically this may be a bandpass filter with a passband of 20-80 Hz (e.g., a $4^{th}$ order Butterworth characteristic). More complex target functions may be utilized, particularly in automotive applications.

Figure 12:
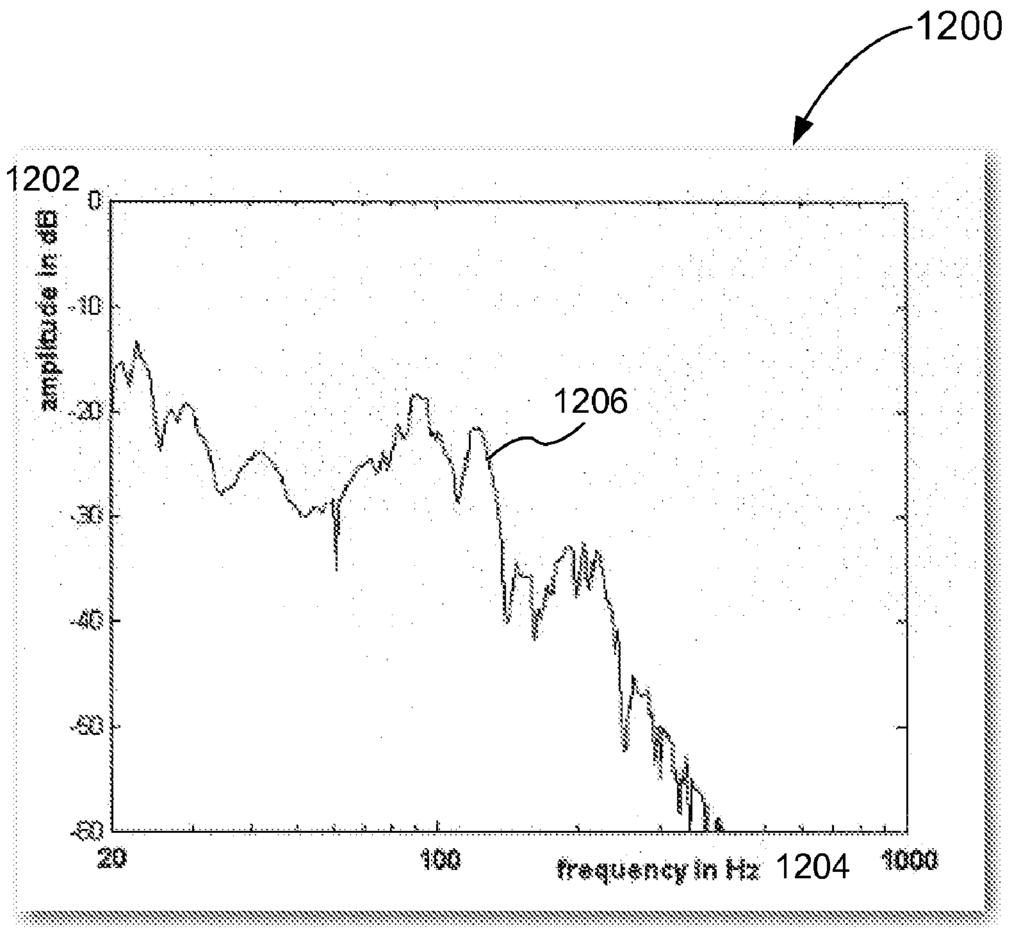
FIG. 12 shows a graphical representation of an example of a plot of amplitude versus frequency (in Hz) of an approximated low-frequency FIR EQ filter impulse response produced by the method described in FIG. 11.

Step 306, FIG. 3, where the sequence (impulse response) is multiplied by a rectangular or other time window, is not included in process 1100 because correction of the complete room impulse response ("RIR") is possible and also desirable at low frequencies. Smoothing of peaks, however, applies similarly as in the near-field, HF-EQ process and this takes place in step 1106. In step 1108, the resulting FIR filter may be scaled to an average loudness level, and directly implemented at a lower sample rate (typically 375 Hz, which corresponds to a decimation ratio of 64 at a frequency of 48 kHz) using decimation and interpolation filters, as shown by decimation filter 208 and interpolation filter 214, FIG. 2. FIG. 12 shows a graphical representation 1200 of an example of a plot 1206 of magnitude 1202 (in dBs) versus frequency 1204 (in Hz) of a typical Bass EQ filter frequency response.

A mid-frequency ("MF") EQ operates in the frequency range of, for example, 100 Hz-1 kHz. Room impulse responses may be captured by a microphone that is located at the desired listening location. In FIG. 13, a flow chart illustrating an example of another room equalization method is shown, where this method is designed for a far-field, mid-frequency EQ. The process 1300 starts in step 1302 and in step 1304, a room impulse response ("RIR") may be determined at a listening location, Steps 1304, 1306, 1308, 1310, and 1312 are similar to the corresponding steps of FIG. 3; however, the parameters are chosen differently.

In step 1306, the sequence (i.e., the impulse response) is multiplied by a rectangular or other time window, thus setting samples above a defined value $t_2$ to zero. This time windowing now has a larger impact, because major parts of the measured impulse response are cut off (see FIG. 14). As a result, only the source (i.e., the loudspeaker) and its direct adjacent surfaces are included, thus focusing on source, not room, correction. This leads to increased robustness with respect to microphone placement, and thus optimum correction over the entire listening area, not just a single point.

Next, in step 1308, the magnitude spectrum F(i), with i=1, . . . , N/2, is generated using an N-point FFT, where, for example, N=8192, In step 1310, the magnitude spectrum determined in step 1308 is smoothed with a smoothing factor $sm_3$, resulting in $Fs(i)=\text{mean}\{F(i/sm_3) \ldots F(i*sm_3)\}$. Typically, the smoothing factor $sm_3$ used in the far-field, MF EQ, is much larger than the smoothing factor used in the HF EQ (typically, $sm_3$=1.4-2.0), so that only the overall trend will be considered, not fine details. Also, the MF EQ does not apply separate smoothing of peaks and dips, as shown in step 314, FIG. 3.

In step 1312, the logarithmic magnitude spectrum is determined and normalized to a prescribed maximum gain. In step 1314, the EQ filter frequency response may be determined by negating the log-magnitude spectrum of step 1312 and adding a high-pass target function (typically, 80-200 Hz), and in step 1316, the EQ filter frequency response is set to zero dB above its operating range. The process 1300 then ends in step 1320.

Figure 14:
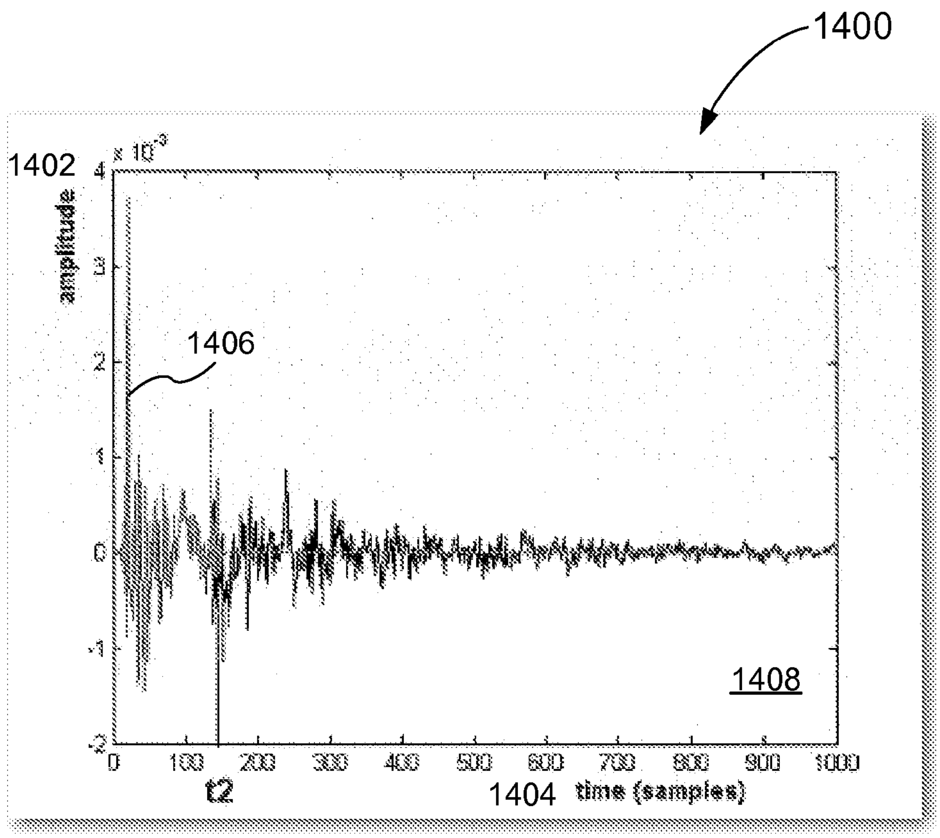
FIG. 14 shows a graphical representation of an example of a plot of amplitude versus time (in samples) of a windowed far-field room impulse response produced by the method described in FIG. 13.

FIG. 14 shows a graphical representation 1400 of an example of a plot 1406 of amplitude 1402 (in dBs) versus time 1404 (in samples) of the RIR generated in step 1304 of FIG. 1304. The RIR is multiplied by a time window 1408 for samples above a defined value $t_2$ such that these samples are set to zero. Typically, $t_2$ may be equal to 16 . . . 32 millisecs ("ms") or 100-200 samples at a sample rate of 8 kHz (in FIG.

4, $t_2$ is equal to approximately 130 samples). As noted above when discussing FIG. 13, this "windowing" cuts off major parts of the RIR.

Figure 15:
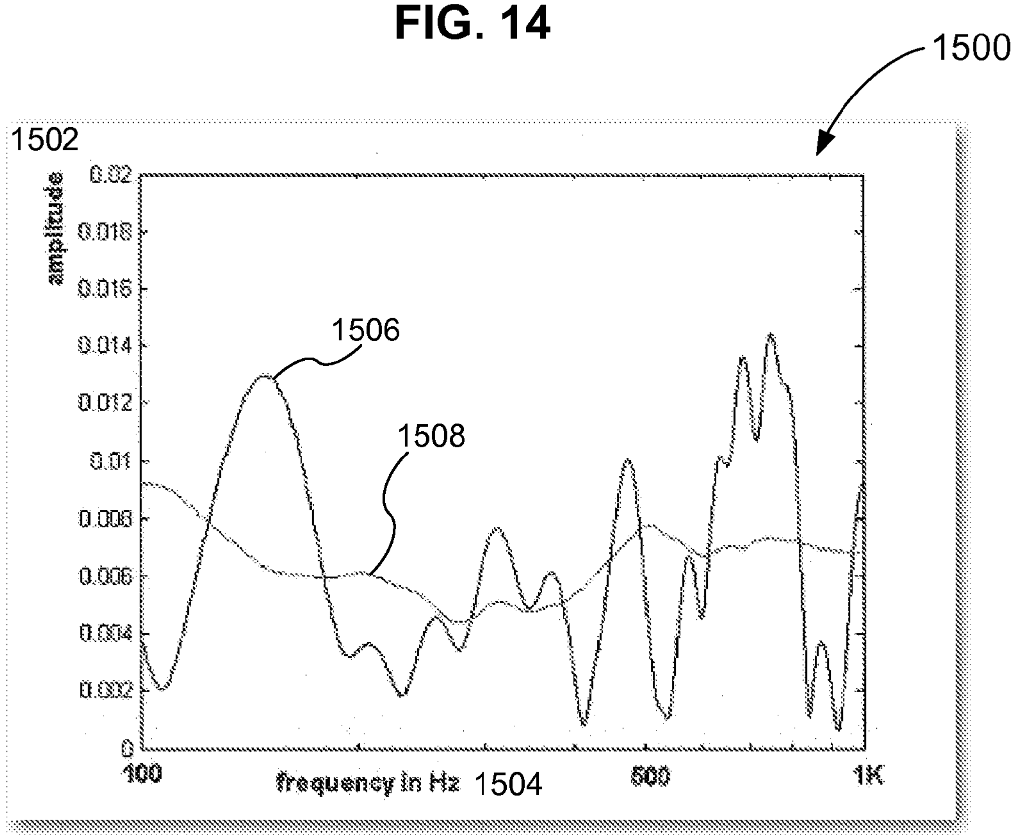
FIG. 15 shows a graphical representation of an example of plots of amplitude versus frequency (in Hz) of a raw, measured and a smoothed far-field spectrum at mid frequencies produced by the method described in FIG. 13.

Turning to FIG. 15, a graphical representation 1500 of an example of spectral plots 1506 and 1508 of amplitude 1502 (in dBs) versus frequency 504 (in Hz) for the RIR 1406 of FIG. 14 is shown. Plot 1506 is the amplitude spectrum F(i), with i=1, . . . , N/2, computed using an N-point FFT, where N=8192. Plot 1508 is the amplitude spectrum of plot 1506 smoothed with a smoothing factor $sm_3$, resulting in Fs(i) =mean {F(i/$sm_3$) . . . F(i*$sm_3$)}. As noted above when discussing FIG. 13, the larger smoothing coefficient $sm_3$ generates a plot 1508 that takes into account only the overall trend, not fine details.

Figure 16:
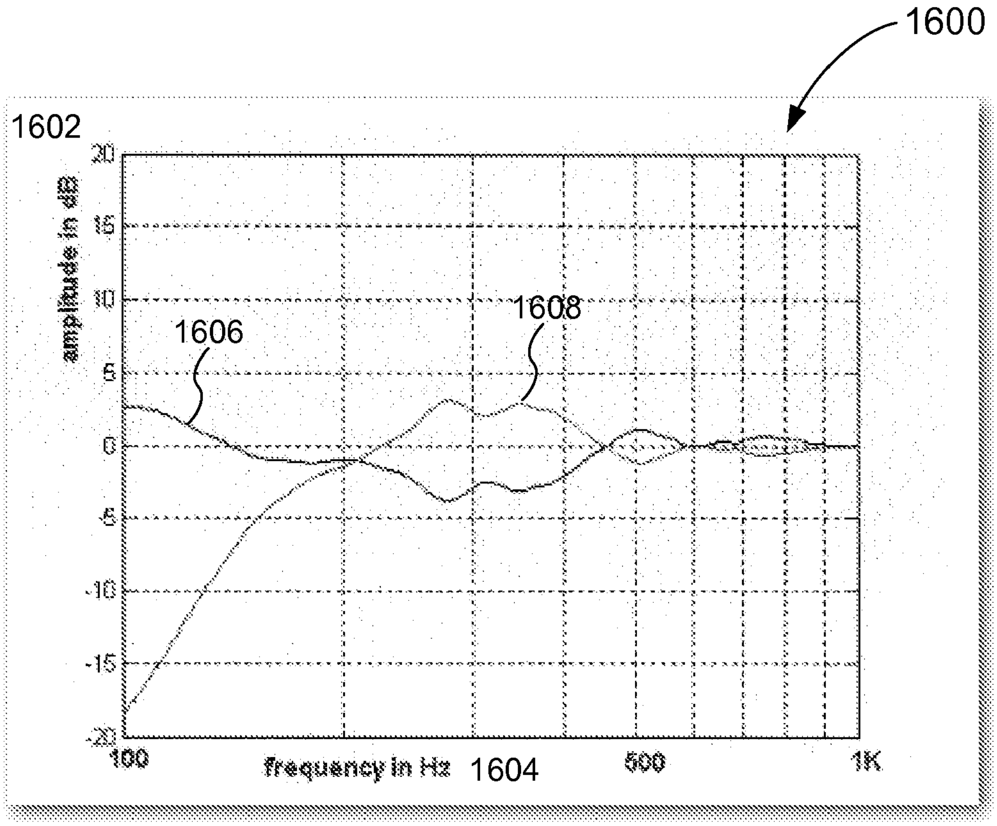
FIG. 16 shows a graphical representation of an example of plots of amplitude versus frequency (in Hz) of a smoothed spectrum and an EQ filter frequency response produced by the method described in FIG. 13.
Figure 17:
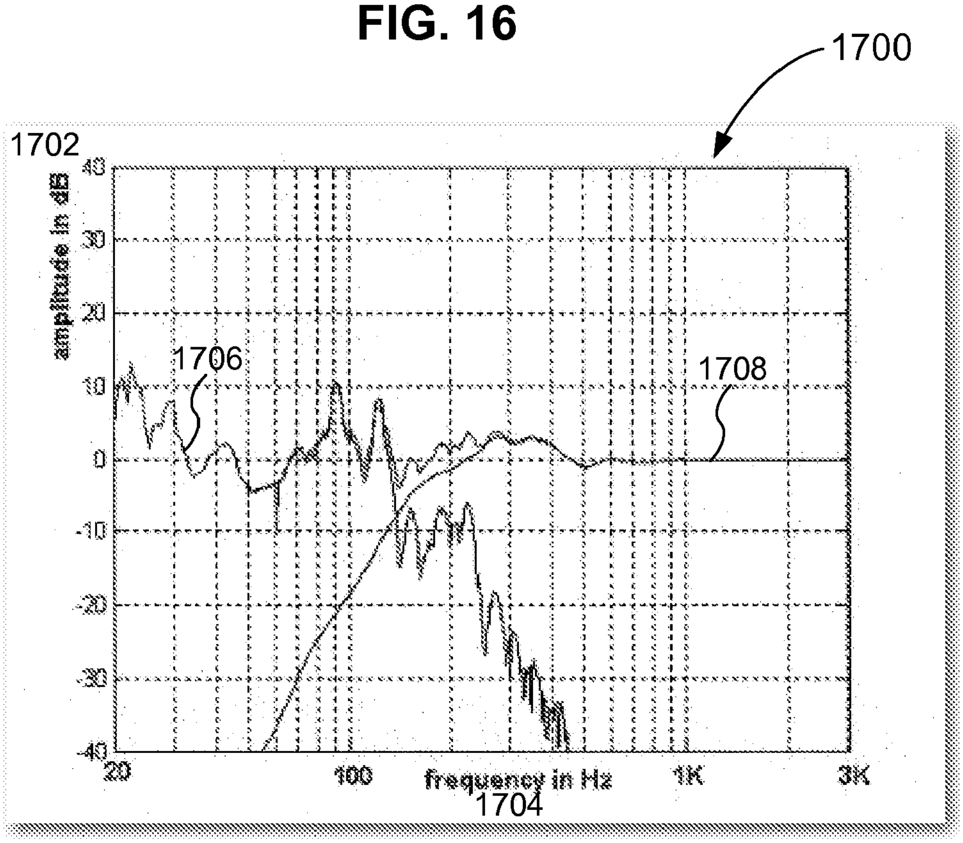
FIG. 17 shows a graphical representation of another example of plots of amplitude versus frequency (in Hz) of low- and mid-frequency EQ filter frequency responses produced by the method described in FIG. 13.
Figure 18:
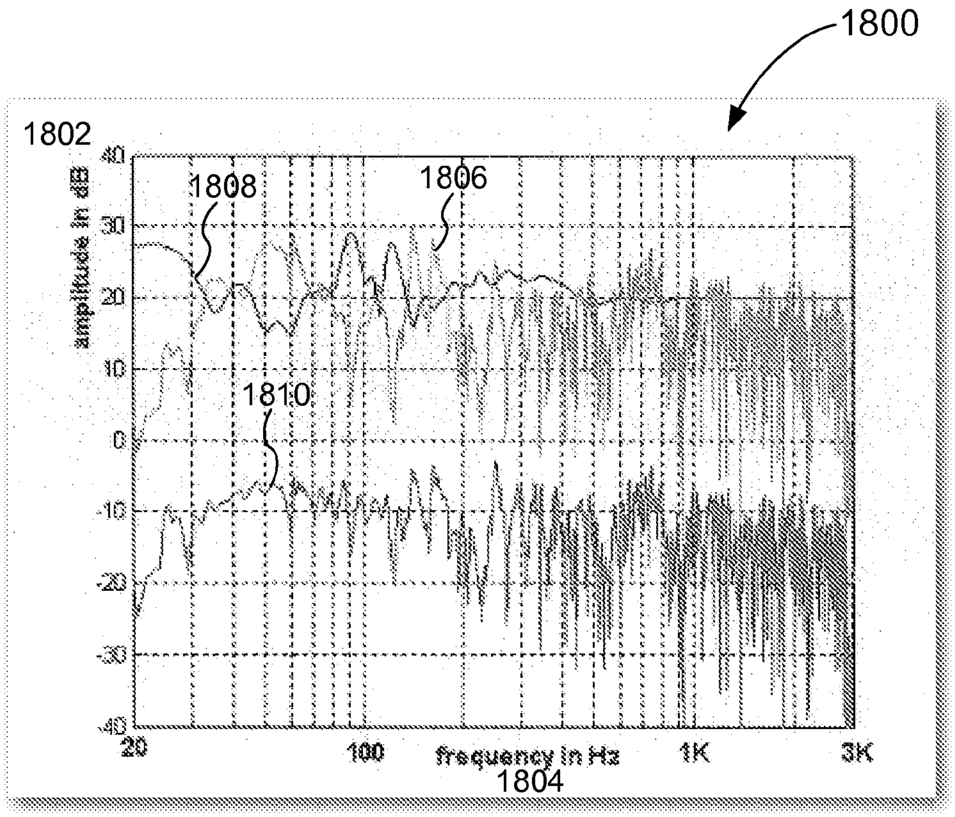
FIG. 18 shows a graphical representation of an example of plots of amplitude versus frequency (in Hz) of EQ filter frequency response and room responses before and after room correction produced by the method described in FIG. 13.

FIG. 16 shows a graphical representation 1600 of an example of plots 1606 and 1608 of amplitude 1602 (in dBs) versus frequency 1604 (in Hz), where plot 1606 is a plot of the smoothed log-magnitude spectrum of the measured response and plot 1608 is a plot of the EQ filter impulse response obtained using a target high pass function. Turning to FIG. 17, a graphical representation 1700 of an example of plots 1706 and 1708 of amplitude 1702 (in dBs) versus frequency 1704 (in Hz) is shown, Plots 1706 and 1708 are the frequency responses of low- and mid-frequency EQ filters, respectively. FIG. 18 shows a graphical representation 1800 of all example of plots 1806, 1808, and 1810 of amplitude 1802 (in dBs) versus frequency 1804 (in Hz), where plot 1806 is a plot of the inverse system, plot 1808 is a plot of the log-magnitude spectrum that has been smoothed with a smoothing factor, and plot 1810 is the sum of 1806 and 1808, shifted downwards for better visibility, showing the result after EQ.

Figure 19:
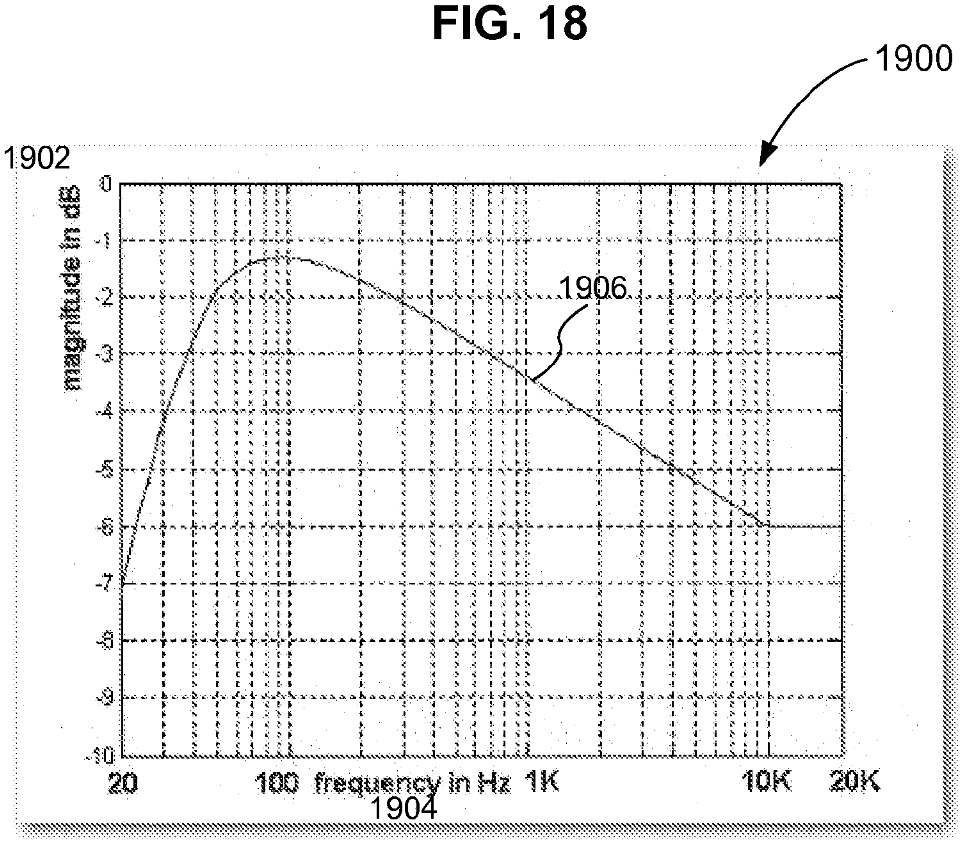
FIG. 19 shows a graphical representation of an example of a plot of a frequency response of a target function produced by the method described in FIG. 13.

In automotive applications, it is no longer necessary, or desirable, to distinguish between near- and far-field responses. More complex target functions, such as that shown in FIG. 19, may be utilized in order to predict average responses at the automobile seats that include direct and reflected sound fields. FIG. 19 shows a graphical representation 1900 of an example of a plot 1906 of magnitude 702 (in dBs) versus frequency 704 (in Hz) of an EQ filter frequency response generated using another example of a target function. The equalization may be performed as described, using different smoothing factors in different frequency bands. Input data may be obtained by spatial averaging between different locations around the listener's head, and between the seats. Also, weighting factors may be applied to emphasize equalization quality at a particular seat, while compromising performance at other seats.

Figure 20:
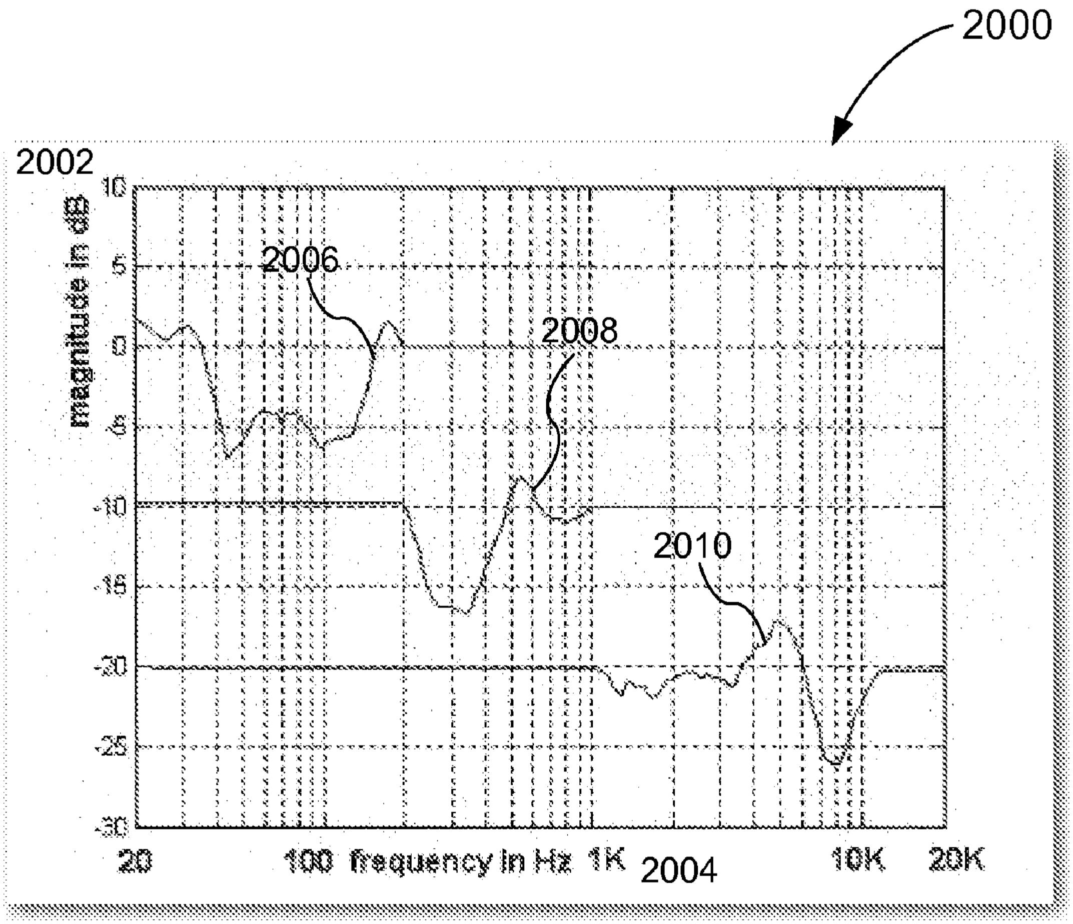
FIG. 20 shows a graphical representation of an example of a plot of the frequency responses of three bands of an EQ filter produced by the method described in FIG. 13.

In order to save processing costs and minimize complexity, equalization may be performed throughout the whole frequency band at once. However, the resulting filter impulse response may be split into several bands, as shown in FIG. 20. In FIG. 20, a graphical representation 2000 of an example of plots 2006, 2008, and 2010 of magnitude 2002 (in dBs) versus frequency 2004 (in Hz) of EQ filter impulse responses is shown, Plots 2006, 2008, and 2010 depict the frequency spectra for the low, medium, and high frequency bands, respectively. It is then easier to approximate the individual, band-limited responses separately by low-order IIR filters using, for example, the Steiglitz-McBride method as described earlier. The resulting individual EQ-sections may then be connected in series.

Persons skilled in the art will understand and appreciate, that one or more processes, sub-processes, or process steps described in connection with FIGS. 3, 11, and 13 may be performed by hardware and/or software. Additionally, the WBES described above may be implemented completely in software that would be executed within a processor or plurality of processors in a networked environment. Examples of a processor include but are not limited to microprocessor, general purpose processor, combination of processors, DSP, any logic or decision processing unit regardless of method of operation, instructions execution/system/apparatus/device and/or ASIC. If the process is performed by software, the software may reside in software memory (not shown) in the device used to execute the software. The software in software memory may include an ordered listing of executable instructions for implementing logical functions (i.e., "logic" that may be implemented either in digital form such as digital circuitry or source code or optical circuitry or chemical or biochemical in analog form such as analog circuitry or an analog source such an analog electrical, sound or video signal), and may selectively be embodied in any signal-bearing (such as a machine-readable and/or computer-readable) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "machine-readable medium," "computer-readable medium," and/or "signal-bearing medium" (herein known as a "signal-bearing medium") is any means that may contain, store, communicate, propagate, or transport the program for use by or in connection with the instruction execution system, apparatus, or device. The signal-bearing medium may selectively be, for example but not limited to, an electronic, magnetic, optical, electromagnetic, infrared, or semiconductor system, apparatus, device, air, water, or propagation medium. More specific examples, but nonetheless a non-exhaustive list, of computer-readable media would include the following: an electrical connection (electronic) having one or more wires; a portable computer diskette (magnetic); a RAM (electronic); a read-only memory "ROM" (electronic); an erasable programmable read-only memory (EPROM or Flash memory) (electronic); an optical fiber (optical); and a portable compact disc read-only memory "CDROM" (optical). Note that the computer-readable medium may even be paper or another suitable medium upon which the program is printed, as the program can be electronically captured, via, for instance, optical scanning of the paper or other medium, then compiled, interpreted or otherwise processed in a suitable manner if necessary, and then stored in a computer memory. Additionally, it is appreciated by those skilled in the art that a signal-bearing medium may include carrier wave signals on propagated signals in telecommunication and/or network distributed systems. These propagated signals may be computer (i.e., machine) data signals embodied in the carrier wave signal. The computer/machine data signals may include data or software that is transported or interacts with the carrier wave signal.

While the foregoing descriptions refer to the use of a wide band equalization system in smaller enclosed spaces, such as a home theater or automobile, the subject matter is not limited to such use. Any electronic system or component that measures and processes signals produced in an audio or sound system that could benefit from the functionality provided by the components described above may be implemented as the elements of the invention.

Moreover, it will be understood that the foregoing description of numerous implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed is:

1. A method for equalizing an audio system using near- and far-field measurement data, the method comprising:

capturing a set of room impulse responses ("RIRs") at a plurality of listening locations of the audio system;

determining low-frequency finite impulse response ("FIR") coefficients for a low-frequency FIR filter;

determining mid-frequency FIR coefficients for a mid-frequency FIR filter;

determining high-frequency FIR coefficients for a high-frequency FIR filter;

generating the low-frequency FIR filter utilizing the low-frequency FIR coefficients;

generating the mid-frequency FIR filter utilizing the mid-frequency FIR coefficients;

generating the high-frequency FIR filter utilizing the high-frequency FIR coefficients;

generating an at least one low-frequency filter of the audio system utilizing a subwoofer equalizer ("EQ") that includes the low-frequency FIR filter;

generating an at least one mid-frequency filter of the audio system as a plurality of cascaded infinite impulse response ("IIR") filters that are derived from the mid-frequency FIR filter; and generating an at least one high-frequency filter of the audio system as a plurality of cascaded IIR filters that are derived from the high-frequency FIR filter.

2. The method of claim 1, wherein the subwoofer EQ further includes a decimator filter and an interpolator filter.

3. The method of claim 1, wherein generating the low-frequency FIR filter includes:

determining a low-frequency inverse spectrum from the captured set of RIRs; and multiplying the captured low-frequency inverse spectrum by a target function that results in an EQ filter frequency response.

4. The method of claim 3, wherein the target function is a bandpass filter with $4^{th}$ order low-pass and high-pass Butterworth filter characteristics.

5. The method of claim 3, wherein determining the low-frequency inverse spectrum further includes smoothing peaks of the EQ filter frequency response utilizing a smoothing factor.

6. The method of claim 1, wherein generating the high-frequency FIR filter coefficients includes:

multiplying a near-field RIR derived from the captured set of RIRs by a first time window;

determining the magnitude spectrum of the windowed near-field RIR;

smoothing the magnitude spectrum with a first smoothing factor;

determining a log-magnitude inverse spectrum of the smoothed magnitude spectrum;

smoothing the peaks of the log-magnitude inverse spectrum with a second smoothing factor to derive a high-frequency EQ filter spectrum;

scaling the high-frequency EQ filter spectrum to a gain equal to zero decibels at an operating frequency fg;

limiting the response of the high-frequency EQ filter spectrum to an upper operating frequency fgu;

clipping the gain of the high-frequency EQ filter spectrum to a maximum allowed gain;

determining an EQ FIR filter impulse response out of the log-magnitude inverse spectrum; and applying a second time window to the EQ FIR filter impulse response.

7. The method of claim 6, wherein determining the EQ FIR filter impulse response out of the log-magnitude inverse spectrum is implemented utilizing a Hilbert transform.

8. The method of claim 6, wherein the second smoothing factor is greater than the first smoothing factor.

9. The method of claim 1, wherein generating the mid-frequency FIR filter includes:

multiplying a far-field RIR derived from the set of captured RIRs by a first time window;

determining a magnitude spectrum of the windowed RIR utilizing an N-point fast Fourier transform ("FFT");

smoothing the magnitude spectrum with a first smoothing factor;

determining a log-magnitude inverse spectrum of the smoothed magnitude spectrum; and determining an EQ filter frequency response out of the log-magnitude inverse spectrum utilizing a target function.

10. The method of claim 1, wherein the equalization of the low-frequency signals, the mid-frequency signals, and the high-frequency signals is performed simultaneously.

11. A Wide-band Equalization System ("WBES") for equalizing an audio system using near- and far-field measurement data, the WBES comprising:

a bass manager in signal communication with a signal source;

a subwoofer EQ in signal communication with the bass manager, and configured to receive low-frequency signals from the bass manager; and a plurality of satellite channels in signal communication with the bass manager, and configured to receive mid- and high-frequency signals from the bass manager.

12. The WBES of claim 11, wherein the subwoofer EQ includes a decimator filter, the at least one low-frequency FIR filter, and an interpolator filter.

13. The WBES of claim 11, wherein each of the plurality of satellite channels includes an at least one mid-frequency IIR filter and an at least one high-frequency IIR filter, where the at least one mid-frequency IIR filter and the at least one high-frequency IIR filter are generated from the at least one mid-frequency FIR filter and the at least one high-frequency FIR filter, respectively.

14. The WBES of claim 13, further including a plurality of cascaded IIR filters that are generated from the at least one mid-frequency FIR filter and the at least one high-frequency FIR filter, respectively.

15. A Wide-band Equalization System ("WBES") for equalizing an audio system using near- and far-field measurement data, the WBES comprising:

means for capturing a set of room impulse responses ("RIRs") at a plurality of listening locations of the audio system;

means for determining low-frequency finite impulse response ("FIR") coefficients for a low-frequency FIR filter;

means for determining mid-frequency FIR coefficients for a mid-frequency FIR filter;

means for determining high-frequency FIR coefficients for a high-frequency FIR filter;

means for generating the low-frequency FIR filter utilizing the low-frequency FIR coefficients;

means for generating the mid-frequency FIR filter utilizing the mid-frequency FIR coefficients;

means for generating the high-frequency FIR filter utilizing the high-frequency FIR coefficients;

means for generating an at least one low-frequency filter of the audio system utilizing a subwoofer equalizer ("EQ") that includes the low-frequency FIR filter;

means for generating an at least one mid-frequency filter of the audio system as a plurality of cascaded infinite impulse response ("IIR") filters that are derived from the mid-frequency FIR filter; and means for generating an at least one high-frequency filter of the audio system as a plurality of cascaded IIR filters that are derived from the high-frequency FIR filter.

16. The WBES of claim 15, wherein the means for generating the low-frequency FIR filter includes:

means for determining a low-frequency inverse spectrum from the captured set of RIRs;

means for multiplying the captured low-frequency inverse spectrum by a target function that results in an EQ filter frequency response.

17. The WBES of claim 16, wherein the means for determining the low-frequency inverse spectrum further includes means for smoothing peaks of the EQ filter frequency response utilizing a smoothing factor.

18. The WBES of claim 15, wherein the means for generating the high-frequency FIR filter coefficients includes:

means for multiplying a near-field RIR derived from the captured set of RIRs by a first time window;

means for determining the magnitude spectrum of the windowed near-field RIR;

means for smoothing the magnitude spectrum with a first smoothing factor;

means for determining a log-magnitude inverse spectrum of the smoothed magnitude spectrum;

means for smoothing the peaks of the log-magnitude inverse spectrum with a second smoothing factor to derive a high-frequency EQ filter spectrum;

means for scaling the high-frequency EQ filter spectrum to a gain equal to zero decibels at an operating frequency fg;

means for limiting the response of the high-frequency EQ filter spectrum to an upper operating frequency fgu;

means for clipping the gain of the high-frequency EQ filter spectrum to a maximum allowed gain;

means for determining an EQ FIR filter impulse response out of the log-magnitude inverse spectrum; and means for applying a second time window to the EQ FIR filter impulse response.

19. The WBES of claim 15, wherein the means for generating the mid-frequency FIR filter includes:

means for multiplying a far-field RIR derived from the set of captured RIRs by a first time window;

means for determining a magnitude spectrum of the windowed RIR utilizing an N-point fast Fourier transform ("FFT");

means for smoothing the magnitude spectrum with a first smoothing factor;

means for determining a log-magnitude inverse spectrum of the smoothed magnitude spectrum; and means for determining an EQ filter frequency response out of the log-magnitude inverse spectrum utilizing a target function.

20. The WBES of claim 15, wherein the means for determining the low-frequency, the mid-frequency, and the high-frequency FIR coefficients includes a digital signal processor ("DSP").

21. The WBES of claim 15, wherein the means for generating the at least one low-frequency filter of the audio system includes a DSP.

22. The WBES of claim 11, wherein the means for generating the at least one mid-frequency filter of the audio system includes a DSP.

23. The WBES of claim 11, wherein the means for generating the at least one high-frequency filter of the audio system includes a DSP.

* * * * *

UNITED STATES PATENT AND TRADEMARK OFFICE

CERTIFICATE OF CORRECTION

PATENT NO. : 8,121,312 B2
APPLICATION NO. : 12/293062
DATED : February 21, 2012
INVENTOR(S) : Horbach et al.

It is certified that error appears in the above-identified patent and that said Letters Patent is hereby corrected as shown below:

In FIG. 1, an arrow should connect the “Signal Source” 104 to the “Preamplifier” 106.

In FIG. 1, an arrow should connect the “Equalizer” 108 to the “Power Amplifier” 110.

At column 7, line 48, “...magnitude 602...” should be changed to -- magnitude 1002 --.

At column 7, line 49, “...magnitude 604...” should be changed to -- magnitude 1004 --.

At column 8, lines 17–18, “...decimation filter 208...” should be changed to -- decimation filter 210 --.

At column 8, line 64, “...FIG. 1304. The...” should be changed to -- FIG. 13. The --.

At column 9, line 6, “...frequency 504...” should be changed to -- frequency 1504 --.

At column 9, line 38, “...magnitude 702...” should be changed to -- magnitude 1902 --.

At column 9, line 39, “...frequency 704...” should be changed to -- frequency 1904 --.

Signed and Sealed this
Twenty-ninth Day of January, 2013

David J. Kappos
*Director of the United States Patent and Trademark Office*